(12) United States Patent
Yoo

(10) Patent No.: US 10,109,466 B2
(45) Date of Patent: Oct. 23, 2018

(54) SUPPORT UNIT AND APPARATUS FOR TREATING SUBSTRATE

(71) Applicant: PSK Inc., Hwaseong-si, Gyeonggi-do (KR)

(72) Inventor: Dong Kun Yoo, Hwaseong-si (KR)

(73) Assignee: PSK INC., Hwaseong-si, Gyeonggi-Do (KR)

(*) Notice: Subject to any disclaimer, the term of this patent is extended or adjusted under 35 U.S.C. 154(b) by 538 days.

(21) Appl. No.: 14/557,961

(22) Filed: Dec. 2, 2014

(65) Prior Publication Data
US 2015/0206723 A1 Jul. 23, 2015

(30) Foreign Application Priority Data
Jan. 17, 2014 (KR) .................. 10-2014-0005922

(51) Int. Cl.
*H01J 37/32* (2006.01)
*H01L 21/683* (2006.01)
*H01L 21/67* (2006.01)
*C23C 16/458* (2006.01)
*H01L 21/673* (2006.01)
(Continued)

(52) U.S. Cl.
CPC .... *H01J 37/32715* (2013.01); *H01J 37/3299* (2013.01); *H01J 37/32724* (2013.01); *H01J 37/32935* (2013.01); *H01L 21/67103* (2013.01); *H01L 21/67115* (2013.01); *H01L 21/67253* (2013.01); *H01L 21/67288* (2013.01); *C23C 14/50* (2013.01); *C23C 16/4583* (2013.01); *H01L 21/67309* (2013.01); *H01L 21/67346* (2013.01); *H01L 21/687* (2013.01); *H01L 21/6831* (2013.01); *H01L 21/6833* (2013.01);
(Continued)

(58) Field of Classification Search
None
See application file for complete search history.

(56) References Cited

U.S. PATENT DOCUMENTS 5,294,778 A * 3/1994 Carman ............ H01L 21/67103
118/725
5,620,525 A * 4/1997 van de Ven ............. C23C 16/04
118/724
(Continued)

FOREIGN PATENT DOCUMENTS

KR 2019990037776 10/1999
KR 1020020063014 A 8/2002
(Continued)

OTHER PUBLICATIONS

Machine Generated English Translation of KR 2002-0063014. Published Aug. 1, 2002.*
(Continued)

*Primary Examiner* — Sylvia MacArthur
(74) *Attorney, Agent, or Firm* — Procopio, Cory, Hargreaves & Savitch LLP

(57) ABSTRACT

Provided is a support unit. The support unit includes a support plate having a top surface in which a measurement groove is defined and on which a substrate is placed, and a sensor for measuring a pressure in the measurement groove in the state where the substrate is placed on the support plate. The measurement groove has a main measurement groove that extends from a central area of the support plate up to an edge area of the support plate.

19 Claims, 9 Drawing Sheets

(51) Int. Cl.
H01L 21/687 (2006.01)
C23C 14/50 (2006.01)

(52) U.S. Cl.
CPC .... H01L 21/6838 (2013.01); H01L 21/68714 (2013.01)

(56) References Cited

U.S. PATENT DOCUMENTS

| | | | | |
|---|---|---|---|---|
| 5,868,896 | A * | 2/1999 | Robinson | B24B 37/013 156/701 |
| 8,209,833 | B2 * | 7/2012 | Wallmueller | H01L 21/67103 219/390 |
| 8,226,769 | B2 * | 7/2012 | Matyushkin | H01L 21/67109 118/725 |
| 2005/0092246 | A1 * | 5/2005 | Baumann | C23C 16/4586 118/715 |
| 2015/0206723 | A1 * | 7/2015 | Yoo | H01J 37/32715 156/345.26 |

FOREIGN PATENT DOCUMENTS

| KR | 1020090033247 A | 4/2009 |
|---|---|---|
| KR | 1020130136124 A | 12/2013 |

OTHER PUBLICATIONS

Machine Generated English Translation of KR 10-2013-0136124. Published Dec. 12, 2013.*
Machine Generated English Translation of KR 1999-0037776/ Published Oct. 15, 1999.*

* cited by examiner

SUPPORT UNIT AND APPARATUS FOR TREATING SUBSTRATE

CROSS-REFERENCE TO RELATED APPLICATIONS

This U.S. non-provisional patent application claims priority under 35 U.S.C. § 119 of Korean Patent Application No. 10-2014-0005922, filed on Jan. 17, 2014, the entire contents of which are hereby incorporated by reference.

BACKGROUND OF THE INVENTION

The present invention disclosed herein relates to a support unit and an apparatus for treating a substrate, and more particularly, to a support unit using plasma and an apparatus for treating a substrate.

To manufacture semiconductor devices, various processes such as photolithography, etching, ashing, ion-injection, thin film deposition, and cleaning may be performed on a substrate to form a desired pattern on the substrate. Among these processes, the etching process is a process for removing a heated area selected from a layer formed on the substrate. The etching process may include wet etching and dry etching.

Here, an etching device using plasma may be used for the dry etching. In general, electromagnetic fields may be formed in an inner space of a chamber to form plasma. The electromagnetic fields may excite a process gas provided into the chamber into a plasma state.

Plasma represents an ionized gas containing ions, electrons, and radicals. The plasma may be generated by a very high temperature, strong electric fields, or high-frequency electromagnetic fields (EF). In a process for manufacturing the semiconductor device, the etching process is performed using the plasma. Ion particles contained in plasma collide with a substrate to perform the etching process.

Generally, a sensor for detecting a supported state of the substrate is provided on a support unit. However, since the sensor is disposed on a central portion of the support unit, it is difficult to determine whether the substrate is properly supported. Also, the sensor may not detect a state of the whole substrate, e.g., a case in which the substrate is broken.

SUMMARY OF THE INVENTION

The present invention provides an apparatus for treating a substrate, which includes a support unit that is capable of providing the substrate in position.

The present invention also provides an apparatus for treating a substrate, which includes a support unit that is capable of detecting a state of the substrate.

The feature of the present invention is not limited to the aforesaid, but other features not described herein will be clearly understood by those skilled in the art from descriptions below.

The present invention provides a support unit.

Embodiments of the present invention provide support units including: a support plate having a top surface in which a measurement groove is defined and on which a substrate is placed; and a sensor for measuring a pressure in the measurement groove in the state where the substrate is placed on the support plate, wherein the measurement groove has a main measurement groove that extends from a central area of the support plate up to an edge area of the support plate.

In some embodiments, the main measurement groove may be lengthily defined along a radius direction of the support plate.

In other embodiments, the main measurement groove may be provided in plurality, and the plurality of main measurement grooves may be defined in a radial direction.

In still other embodiments, when viewed from above, the main measurement groove may extend up to the inside of the substrate when the substrate is disposed in position on the support plate.

In even other embodiments, the measurement groove may further include a sub measurement groove having the same center as the support plate and an arc shape, wherein the sub measurement groove may cross the main measurement groove.

In yet other embodiments, the main measurement groove may be connected to the center of the sub measurement groove.

In further embodiments, the sub measurement groove may be provided in plurality, and the plurality of sub measurement grooves may be spaced apart from each other.

In still further embodiments, the plurality of sub measurement grooves may include: an inner sub measurement groove having a first curvature radius; and an outer sub measurement groove having a second curvature radius, wherein the second curvature radius may be greater than the first curvature radius and less than a radius of the substrate.

In even further embodiments, the inner sub measurement groove may be provided in plurality, and the plurality of inner sub measurement grooves may be spaced apart from each other and combined with each other to form a circular shape.

In yet further embodiments, the outer sub measurement groove may be provided in plurality, and the plurality of outer sub measurement grooves may be spaced apart from each other and combined with each other to form a circular shape.

In much further embodiments, the outer sub measurement groove may be connected to an outer end of the main measurement groove.

In still much further embodiments, the support unit may further include a guide groove having a main guide groove defined in the top surface of the support plate and having the same center as the support plate, and when viewed from above, the main guide groove may extend up to the outside of the substrate when the substrate is disposed in position on the support plate and is separated from the measurement groove.

In even much further embodiments, the main guide groove may extend from the central area of the support plate up to a side surface of the support plate.

In yet much further embodiments, the main guide groove may be provided in plurality, and the plurality of main guide grooves may be defined along a radius direction of the support plate.

In some embodiments, the plurality of main guide grooves may have inner ends positioned in the central area of the support plate, and the inner ends may be spaced apart from the center of the support plate.

In other embodiments, the guide groove may further include a sub guide groove having the same center as the support plate and an arc shape, the sub guide groove may cross the main guide groove.

In still other embodiments, the sub guide groove may be provided in plurality, and the plurality of sub guide grooves may respectively correspond to the plurality of main guide grooves and be spaced apart from each other.

In even other embodiments, the plurality of sub guide grooves may include: an inner sub guide groove having a third curvature radius; and an outer sub guide groove having a fourth curvature radius, wherein the third curvature radius may be greater than the first curvature radius and less than the second curvature radius, and the fourth curvature radius is greater than the second curvature radius and less than a radius of the substrate.

In yet other embodiments, the support units may further include a control unit transmitting a pressure value measured by the sensor to determine the supported state of the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
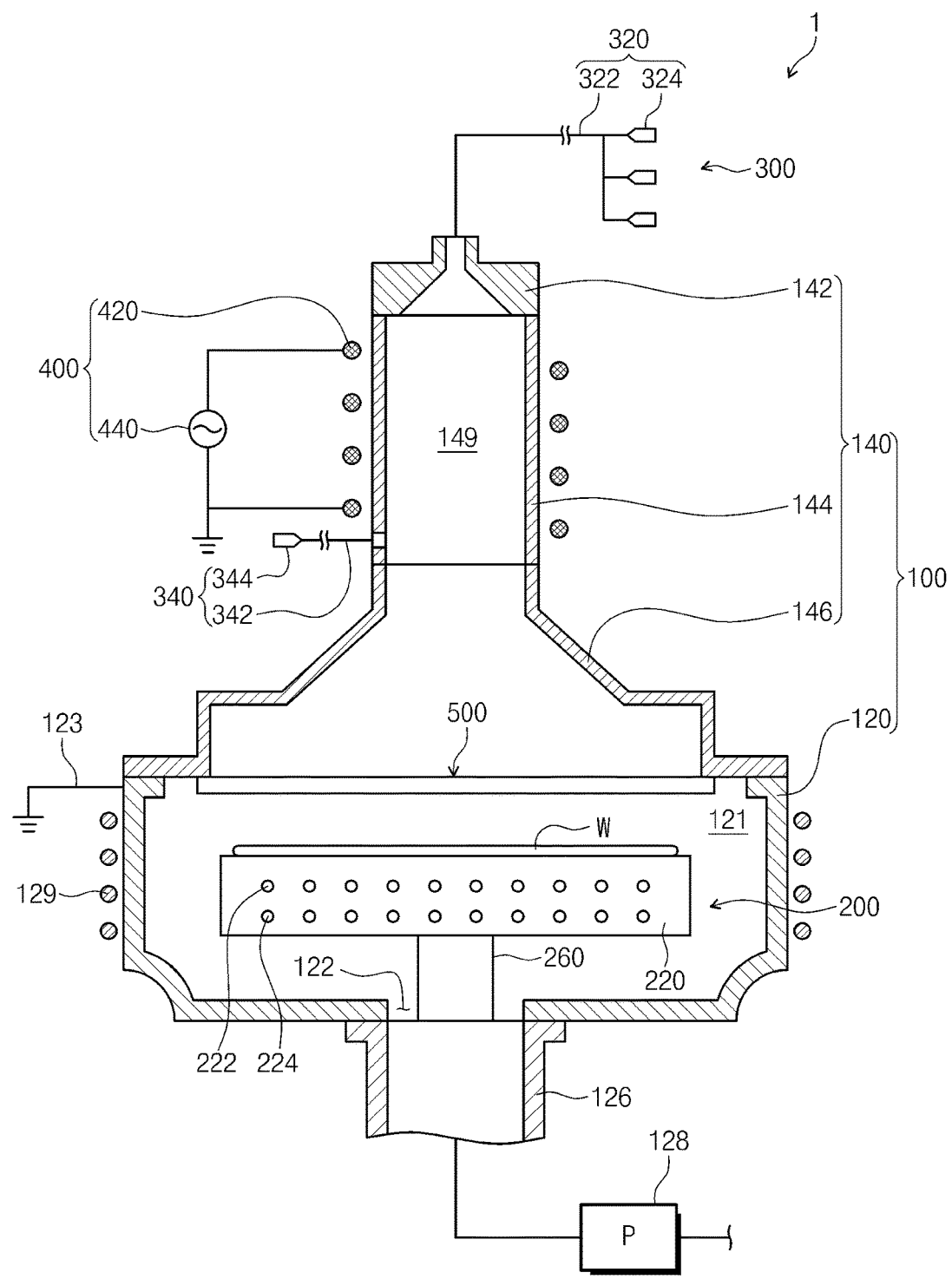
FIG. 1 is a cross-sectional view of a substrate treatment apparatus according to an embodiment of the present invention.

The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

Hereinafter, embodiments of the present invention will be described in detail with reference to the accompanying drawings. In description of the present invention, detailed descriptions related to well-known functions or configurations will be ruled out in order not to unnecessarily obscure subject matters of the present invention.

In the current embodiment, the substrate may be a semiconductor wafer. However, the present invention is not limited thereto, and for example, the substrate may be other types of substrates such as a glass substrate.

Also, the substrate treatment apparatus that etches a substrate by using plasma is exemplified in embodiments of the present invention, but the present invention is not limited thereto. The substrate treatment apparatus may be an apparatus for performing other kinds of processes for treating a substrate by using plasma, such as an ashing process.

FIG. 1 is a cross-sectional view of a substrate treatment apparatus according to an embodiment of the present invention.

Referring to FIG. 1, a substrate treatment apparatus 1 etches a thin film on a substrate W by using plasma. The thin film may be various kinds of films such as a poly silicon film, a silicon oxide film, and a silicon nitrogen film. Also, the thin film may be a natural oxide film or an oxide film that is chemically generated.

The substrate treatment apparatus 1 includes a process chamber 100, a support unit 200, a gas supply unit 300, a plasma source 400, and a baffle 500.

The process chamber 100 has a treatment chamber 120 and a plasma generation chamber 140. The treatment chamber 120 provides a space 121 in which the substrate W is treated by the plasma. The plasma generation chamber 140 provides a space 149 in which the plasma is generated from a process gas.

The treatment chamber 120 has the space 121 having an opened upper portion therein. The treatment chamber 120 may have an approximately cylindrical shape. An opening (not shown) is defined in a sidewall of the treatment chamber 120. The substrate W is taken into the treatment chamber 120 through the opening. The opening may be opened and closed by an opening/closing member such as a door (not shown). An exhaust hole 122 is defined in a bottom surface of the treatment chamber 120. An exhaust line 126 is connected to the exhaust hole 122. A pump 128 is disposed on the exhaust line 126. The pump 128 adjusts an inner pressure of the treatment chamber 120 into a process pressure. A residual gas and byproducts within the treatment chamber 120 may be exhausted to the outside of the treatment chamber 120 through the exhaust line 126. A wall heater 129 may be disposed at the outside of the treatment chamber 120. The wall heater 129 may have a coil shape. The wall heater 129 may be selectively provided in an outer wall of the process chamber 100.

The plasma generation chamber 140 is disposed at the outside of the treatment chamber 120. For example, the plasma generation chamber 140 is disposed on the treatment chamber 120 and coupled to the treatment chamber 120. The plasma generation chamber 140 has a gas port 142, a discharge chamber 144, and a diffusion chamber 146. The gas port 142, the discharge 144, and the diffusion chamber 146 may be successively provided from an upper side. The gas port 142 receives a gas from the outside. The discharge chamber 144 has a hollow cylindrical shape. When viewed from above, the space 149 of the discharge chamber 144 may be less than that 121 of the treatment chamber 120. Plasma may be generated from the gas within the discharge chamber 144. The diffusion chamber 146 supplies the plasma generated in the discharge chamber 144 to the treatment chamber 120. The diffusion chamber 146 has an inner space that gradually increases in diameter toward a lower side thereof. A lower end of the diffusion chamber 146 is coupled to an upper end of the treatment chamber 120, and a sealing member (not shown) is provided therebetween to seal the diffusion chamber 146 and the treatment chamber 120 from the outside.

The process chamber 100 is formed of a conductive material. The process chamber 100 may be grounded through a ground line 123.

Figure 2:
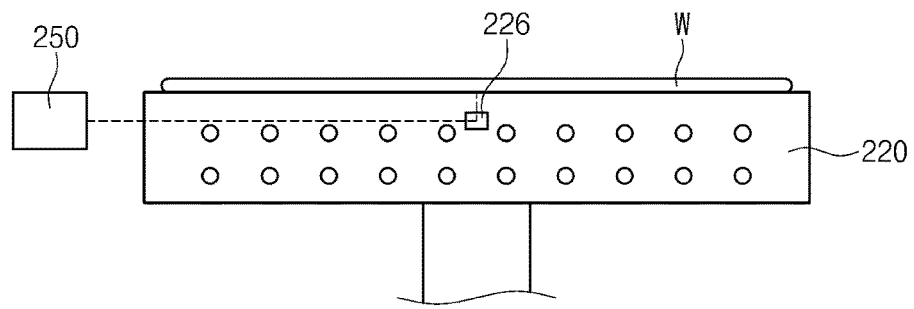
FIG. 2 is a view of a support unit of FIG. 1.

FIG. 2 is a view of a support unit 200 of FIG. 1. The support unit 200 supports the substrate W. The support unit 200 includes a support plate 220, a sensor 226, a support shaft 240, and a control unit 250. The support plate 220 is disposed within the space 121. The support plate has a disk shape. The support plate 220 is supported by the support shaft 240. The substrate W is disposed on a top surface of the support plate 220. An electrode (not shown) is disposed in the support plate 220. The substrate W may be supported by the support plate 220 by an electrostatic force. A heating member 222 may be provided in the support plate 220. For example, the heating member 222 may be provided as a heating wire. Also, a cooling member 224 may be provided in the support plate 220. The cooling member 224 may be provided as a cooling line through which a coolant flows. The heating member 222 may heat the substrate W to a predetermined temperature, and the cooling member 224 may forcibly cool the substrate W.

Figure 3:
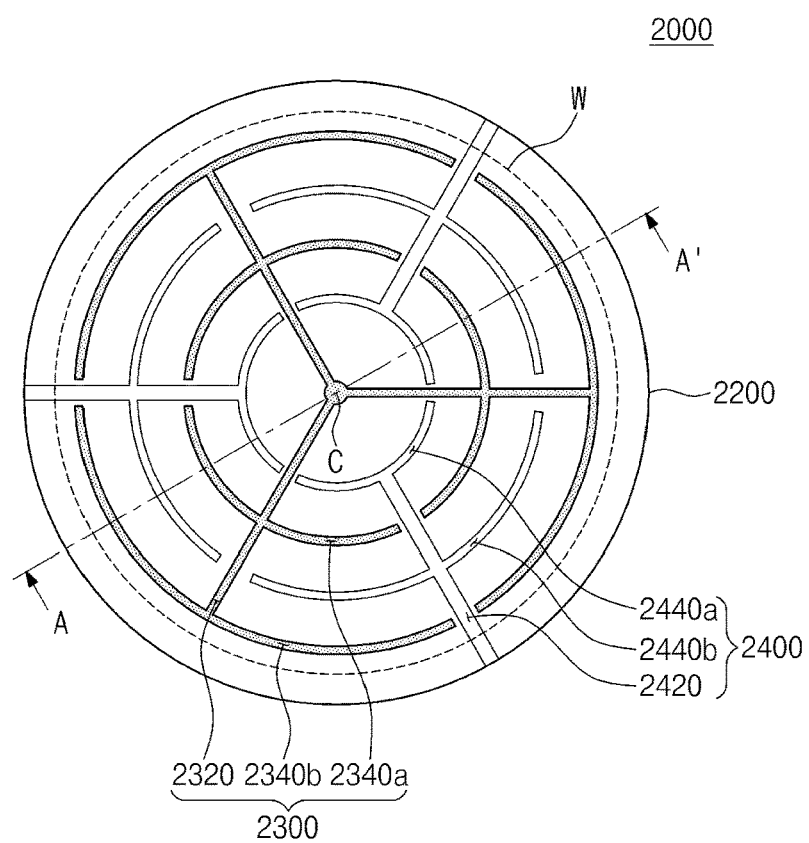
FIG. 3 is a top view of an exemplary support unit of the support unit of FIG. 2.
Figure 4:
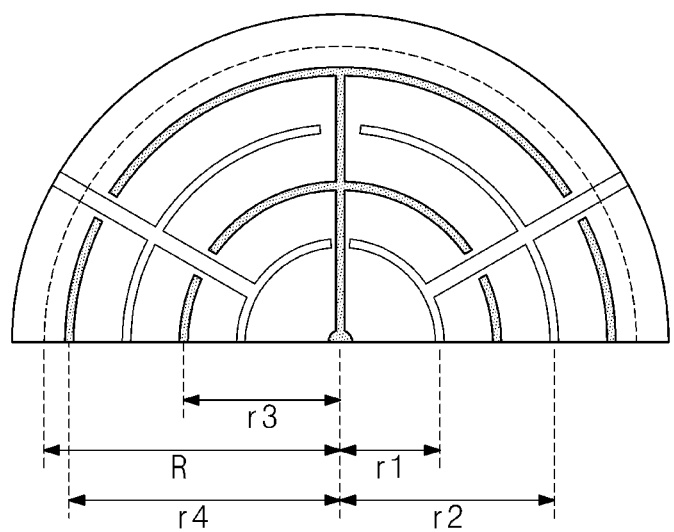
FIG. 4 is a view of the support unit of FIG. 3, taken along line A-A'.
Figure 5:
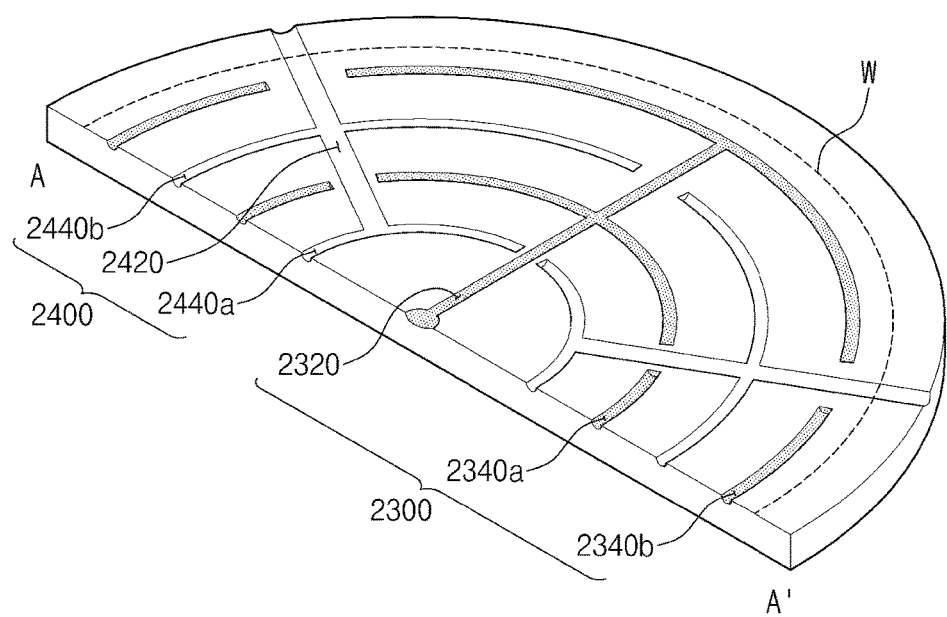
FIG. 5 is a cross-sectional view of the support unit of FIG. 4.
Figure 6:
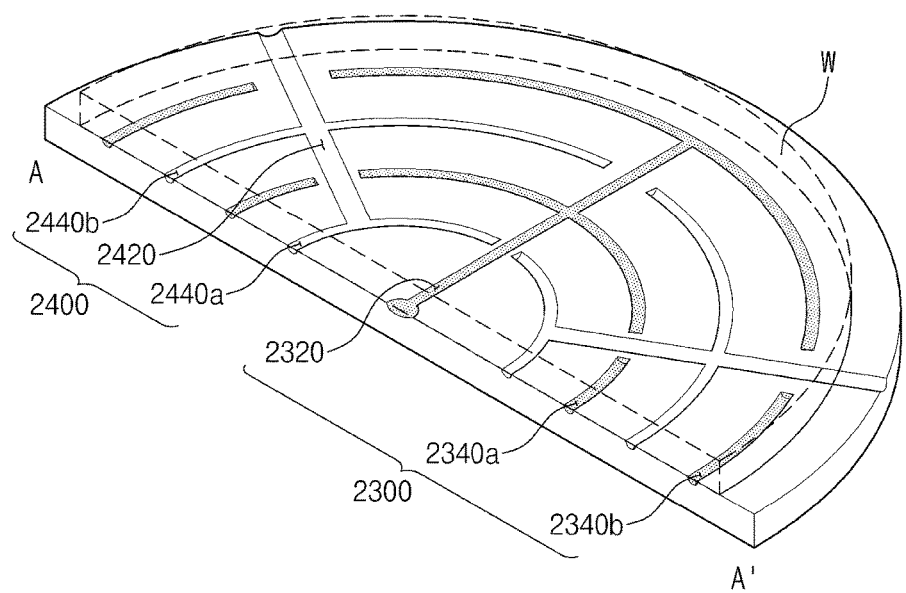
FIG. 6 is a view illustrating a state where the substrate is placed on the support unit of FIG. 5.

FIG. 3 is a top view of an exemplary support unit 2000 of the support unit 200 of FIG. 2, FIG. 4 is a view of the support unit 2000 of FIG. 3, taken along line A-A', FIG. 5 is a cross-sectional view of the support unit 2000 of FIG. 4, and FIG. 6 is a view illustrating a state where the substrate W is placed on the support unit 2000 of FIG. 5.

The support plate 2200 has a measurement groove 2300 and a guide groove 2400. The measurement groove 2300 is defined in the top surface of the support plate 2200. The measurement groove 2300 has a main measurement groove 2320 and a sub measurement groove 2340. The main measurement groove 2320 may extend from a central area of the support plate 2200 to an edge area of the support plate 2200. The main measurement groove 2320 may be lengthily provided along a radius direction of the support plate 2200. The main measurement groove 2320 may be provided in plurality. Here, the plurality of main measurement grooves 2320 may be provided in a radial direction. For example, referring to FIG. 3, three main measurement grooves 2320 may be provided. When the substrate W is disposed in position on the support plate 2200, when viewed from above, the main measurement groove 2320 extends up to an inside of a side surface of the substrate W. The main measurement groove 2320 passes through between inner sub guide grooves 2440a adjacent to each other. Also, the main measurement groove 2320 passes through between outer sub guide grooves 2440b adjacent to each other. Alternatively, the main measurement groove 2320 may communicate with the sub measurement groove 2340. The sub measurement groove 2340 is defined in the top surface of the support plate 2200. As illustrated in FIG. 3, the sub measurement groove 2340 may have an arc shape. The sub measurement groove 2340 and the support plate 2200 may have the same center C. The sub measurement groove 2340 may cross the main measurement groove 2320. Here, the main measurement groove 2320 may be connected to the center C of the sub measurement groove 2340. The sub measurement groove 2340 may be provided in plurality. The plurality of sub measurement grooves 2340 may be spaced apart from each other. The plurality of sub measurement grooves 2340 may correspond to the plurality of main measurement grooves 2320.

Referring to FIG. 3, the sub measurement groove 2340 includes an inner sub measurement groove 2340a and an outer sub measurement groove 2340b. The inner sub measurement groove 2340a has a first curvature radius r1. The outer sub measurement groove 2340b has a second curvature radius r2. The second curvature radius r2 is greater than the first curvature radius r1. Also, the second radium curvature r2 is less than a radius R of the substrate W. Referring to FIG. 3, the inner sub measurement groove 2340a is provided in plurality, and the plurality of inner sub measurement grooves 2340a may be spaced apart from each other. The plurality of inner sub measurement grooves 2340a may be combined to each other to form a circular shape. The outer sub measurement groove 2340b may be provided in plurality. The plurality of outer sub measurement grooves 2340b may be spaced apart from each other. The plurality of outer sub measurement grooves 2340b may be combined to each other to form a circular shape. Here, the outer sub measurement groove 2340b may be connected to an outer end of the main measurement groove 2320.

The groove guide 2400 is defined in the top surface of the support plate 2200. The guide groove 2400 has a main guide groove 2420 and a sub guide groove 2440. The guide groove 2400 is separated from the measurement groove 2300. When the substrate W is disposed in position on the support plate 2200, when viewed from above, the main guide groove 2420 extends up to an outside of the side surface of the substrate W. For example, referring to FIG. 6, the main guide groove 2420 may extend to the side surface of the support plate 2200. The main guide groove 2420 may be lengthily provided along the radius direction of the support plate 2200. The main guide groove 2420 may be provided in plurality. Here, the plurality of main guide grooves 2420 may be provided in the radial direction. For example, three main guide grooves 2420 may be provided. The main guide groove 2420 passes through between the inner sub guide grooves 2440a adjacent to each other. Also, the main guide groove 2420 passes through between the outer sub guide grooves 2440b adjacent to each other. Alternatively, the main guide groove 2420 may communicate with the sub guide groove 2440. An inner end of the main guide groove 2420 is disposed on the central area of the support plate 2200. For example, the inner end of the main guide groove 2420 may be spaced apart from the center C of the support plate 2200. The sub guide groove 2440 is defined in the top surface of the support plate 2200. The sub guide groove 2440 has an arc shape. The sub guide groove 2440 and the support plate 2200 may have the same center. The sub guide groove 2440 may cross the main guide groove 2420. The sub guide groove 2440 may be provided in plurality. The plurality of sub guide grooves 2440 may be spaced apart from each other. The plurality of sub guide grooves 2440 may correspond to the plurality of main guide grooves 2420.

The sub guide groove 2440 includes the inner sub guide groove 2440a and the outer sub guide groove 2440b. The inner sub guide groove 2440a has a third curvature radius r3. The outer sub guide groove 2440b has a fourth curvature radius r4. The third curvature radius r3 is greater than the first curvature radius r1 and less than the second curvature radius r2. The fourth curvature radius r4 is greater than the second curvature radius r2 and less than the radius R of the substrate W. The inner sub guide groove 2440a may be provided in plurality. The plurality of inner sub guide grooves 2440a may be spaced apart from each other. The plurality of inner sub guide grooves 2440a may be combined to each other to form a circular shape. The outer sub guide groove 2440b may be provided in plurality. The plurality of outer sub guide grooves 2440b may be spaced apart from each other. The plurality of outer sub guide grooves 2440b may be combined to each other to form a circular shape. Here, the main guide groove 2420 may extend from the inner sub guide groove 2440a to the side surface of the substrate W.

When the substrate W is placed on the substrate 2200, the sensor measures a pressure in the measurement groove 2300 of the support plate 2200. The sensor 226 may measure whether the substrate W is disposed in position on the support plate 2200. Also, the sensor 226 may measure whether the substrate W is broken. Also, when the substrate W is placed on the support plate 2200, the sensor 226 may measure bending of the substrate W due to a temperature difference. The control unit 250 transmits a pressure value measured from the sensor 226 to determine a support state of the substrate W.

The gas supply unit 300 includes a first gas supply member 320 and a second gas supply member 340.

The first gas supply member 320 includes a first gas supply line 322 and a first gas storage part 324. The first gas supply line 322 is coupled to the gas port 142. A first gas supplied through the gas port 142 may be introduced into the discharge chamber 144 and be excited to plasma within the discharge chamber 144. The first gas may include difluoromethane ($CH_2F_2$), nitrogen ($N_2$), and oxygen ($O_2$). Selectively, the first gas may further include different kinds of gases such as tetrafluoromethane ($CF_4$).

The second gas supply member 340 includes a second gas supply line 342 and a second gas storage part 344. A second gas may be supplied on a path through which the plasma generated from the first gas flows into the treatment chamber 120. For example, the second gas supply line 342 is coupled to the discharge chamber 144 at an area lower than an antenna 420 that will be described later. The second gas may include nitrogen trifluoride ($NF_3$).

According to the above-described structure, the first gas may be directly excited into plasma by a power, and the second gas may be excited into plasma by reaction with the first gas.

In the above-described examples, kinds of the first and second gases may be variously changed. Also, only the first gas supply member 320 may be provided without providing the second gas supply member 340.

The plasma source 400 generates the plasma from the first gas within the discharge chamber 144. For example, the plasma source 400 may be an inductively coupled plasma source 400. The plasma source 400 has the antenna 420 and a power source 440. The antenna 420 is disposed at the outside of the discharge chamber 144 to surround the discharge chamber 144 several times. The antenna has one end connected to the power source 440 and the other end that is grounded. The power source 440 applies a power to the antenna 420. For example, the power source 440 may apply a high-frequency power to the antenna 420.

A baffle 500 is disposed between the treatment chamber 120 and the plasma generation chamber 140. When the plasma is supplied to the substrate W, the baffle 500 may uniformly maintain density and flow of the plasma in a whole region within the treatment chamber 120. The baffle 500 is grounded. For example, the baffle 500 may contact the process chamber 100 and be grounded through the process chamber 100. Selectively, the baffle 500 may be directly connected to a separate ground line. Thus, a radical may be supplied into the treatment chamber 120, and introduction of the ion and electron into the treatment chamber 120 may be prevented by the baffle 500. The baffle 500 is fixed to the process chamber 100. For example, the baffle 500 may be coupled to a lower end of the plasma generation chamber 140.

FIGS. 7 to 10 are views of a support unit according to another embodiment.

Figure 7:
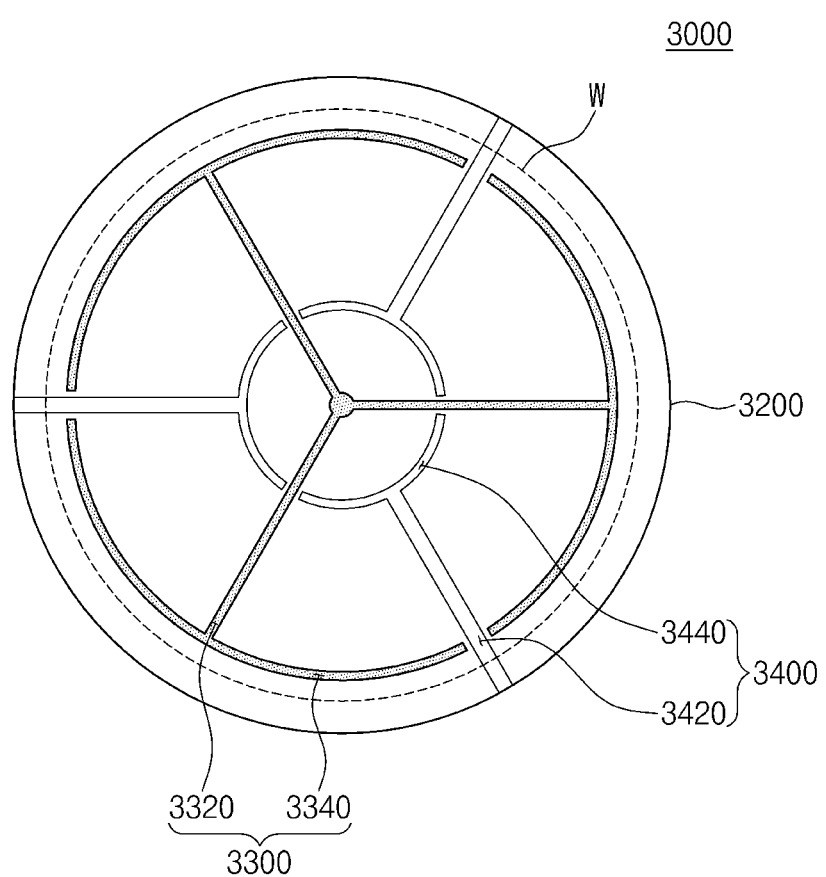
FIGS. 7 to 10 are views of a support unit according to another embodiment.
Figure 8:
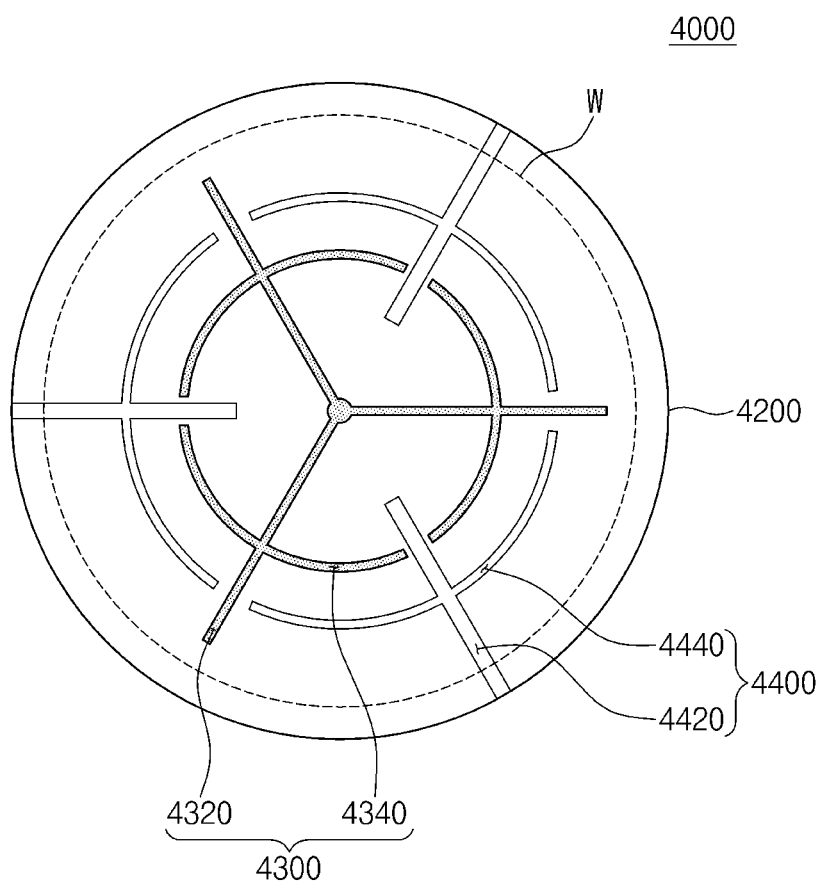

A support unit 3000 of FIG. 7 includes a measurement groove 3300 and a guide groove 3400. The support unit 3000 of FIG. 7 has a shape and function substantially equal or similar to that 2000 of FIG. 3. However, a sub measurement groove 3340 of the support unit 3000 of FIG. 7 is provided as a single sub measurement groove 3340. Also, a sub guide groove 3440 of the support unit 3000 of FIG. 7 is provided as a single sub guide groove 3440. Here, the sub guide groove 3440 is provided inside the substrate W than the sub measurement groove 3340. Alternatively, selectively, as illustrated in FIG. 8, a sub guide groove 4440 may be provided outside the substrate W than a sub measurement groove 4340.

Figure 9:
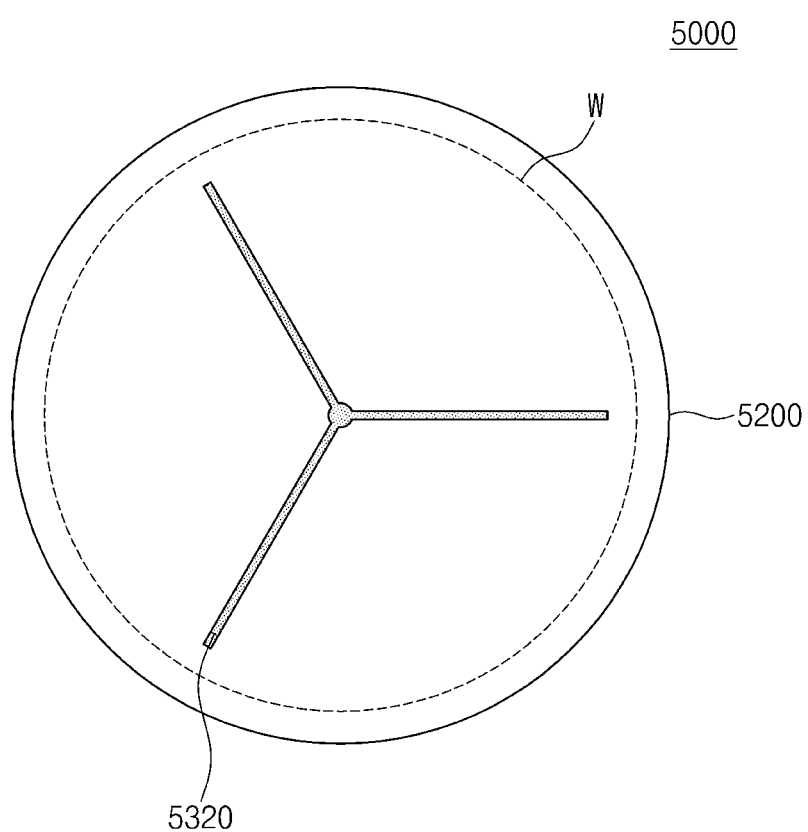

A support unit 5000 of FIG. 9 includes only a measurement groove 5300. The support unit 5000 of FIG. 9 has a shape and function substantially equal or similar to that 2000 of FIG. 3. However, the support unit 5000 of FIG. 9 includes only a measurement groove 5300. For example, the support unit 5000 may include only a main measurement groove 5320. Alternatively, selectively, the support unit 5000 may include the main measurement groove 5320 and a sub measurement groove 5340.

Figure 10:
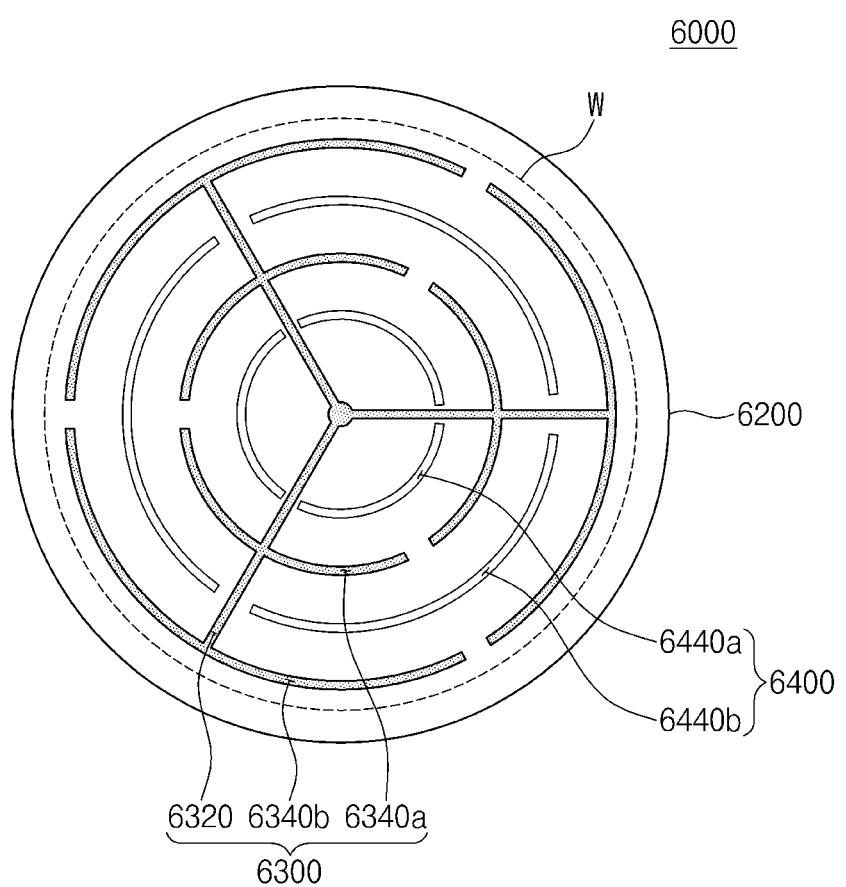

A support unit 6000 of FIG. 10 includes a measurement groove 6300 and a guide groove 6400. The support unit 6000 of FIG. 10 has a shape and function substantially equal or similar to that 2000 of FIG. 3. However, the guide groove 6400 of the support unit 6000 of FIG. 10 only includes a sub guide groove 6440 $a$,6440$b$. Here, the sub measurement groove 6340$a$,6340$b$ may be provided in plurality in an arc shape. However, the sub measurement groove 6340 may have a single circular shape.

According to the embodiments of the present invention, the present invention may provide the substrate treatment apparatus including the support unit that is capable of providing the substrate in position.

Also, the present invention may provide the substrate treatment apparatus including the support unit that is capable of detecting the state of the substrate.

The feature of the present invention is not limited to the aforesaid, but other features not described herein will be clearly understood by those skilled in the art from this specification and the accompanying drawings.

If a person of ordinary skill in the art to which this invention pertains without departing from the essential characteristics of the present invention in the range described above, is only the spirit of the present invention have been described for illustrative purposes, various modifications, additions and substitutions are possible. Therefore, to explain the embodiments disclosed in the present disclosure is not limited to the technical idea of the present disclosure, and are not limited by this embodiment without departing from the scope or spirit of the invention. The scope of protection of the present disclosure, all the technical idea, within the scope of its equivalent shall be construed by the following claims should be construed as being included in the scope of the present disclosure.

What is claimed is:

1. A support unit comprising:
   a support plate having a top surface on which a measurement groove is defined and on which a substrate is placed, the measurement groove forming a contiguous recess between sidewalls in the top surface of the support plate; and
   a sensor configured to measure a pressure in the measurement groove in the state where the substrate is placed on the support plate,
   wherein the measurement groove comprises a main measurement groove that successively extends on the top surface from a central area of the support plate toward an edge area of the support plate,
wherein the support unit further comprises a guide groove having a main guide groove defined on the top surface of the support plate and having the same center as the support plate, and when viewed from above, the main guide groove extends up to the outside of the substrate when the substrate is positioned on the support plate and is separated from the measurement groove.

2. The support unit of claim 1, wherein the main measurement groove extends along a radius direction of the support plate.

3. The support unit of claim 2, wherein the main measurement groove comprises a plurality of main measurement grooves, and the plurality of main measurement grooves extend in a radial direction.

4. The support unit of claim 3, wherein, when viewed from above, the main measurement groove extends under a central region of the substrate when the substrate is positioned on the support plate.

5. The support unit of claim 4, wherein the measurement groove further comprises a sub measurement groove having the same center as the support plate and an arc shape,
wherein the sub measurement groove crosses the main measurement groove.

6. The support unit of claim 5, wherein the main measurement groove is connected to the center of the sub measurement groove.

7. The support unit of claim 6, wherein the sub measurement groove comprises a plurality of sub measurement grooves, and the plurality of sub measurement grooves are spaced apart from each other.

8. The support unit of claim 7, wherein the plurality of sub measurement grooves comprise:
an inner sub measurement groove having a first curvature radius;
and an outer sub measurement groove having a second curvature radius,
wherein the second curvature radius is greater than the first curvature radius and less than a radius of the substrate.

9. The support unit of claim 8, wherein the inner sub measurement groove comprises a plurality of inner sub measurement grooves, and the plurality of inner sub measurement grooves are spaced apart from each other and combined with each other to form a circular shape.

10. The support unit of claim 8, wherein the outer sub measurement groove comprises a plurality of outer sub measurement grooves, and the plurality of outer sub measurement grooves are spaced apart from each other and combined with each other to form a circular shape.

11. The support unit of claim 10, wherein at least one of the plurality of outer sub measurement grooves is connected to an outer end of the main measurement groove.

12. The support unit of claim 1, wherein the main guide groove extends from the central area of the support plate up to a side surface of the support plate.

13. The support unit of claim 12, wherein the main guide groove comprises a plurality of main guide grooves, and the plurality of main guide grooves extend in the radius direction of the support plate.

14. The support unit of claim 13, wherein the plurality of main guide grooves have inner ends positioned in the central area of the support plate, and the inner ends are spaced apart from the center of the support plate.

15. The support unit of claim 1, wherein the guide groove further comprises a sub guide groove having the same center as the support plate and an arc shape, the sub guide groove crosses the main guide groove.

16. The support unit of claim 15, wherein the sub guide groove comprises a plurality of sub guide grooves, and the plurality of sub guide grooves respectively correspond to the plurality of main guide grooves and are spaced apart from each other.

17. The support unit of claim 16, wherein the plurality of sub guide grooves comprise:
an inner sub guide groove having a third curvature radius; and
an outer sub guide groove having a fourth curvature radius,
wherein the third curvature radius is greater than the first curvature radius and less than the second curvature radius, and
the fourth curvature radius is greater than the second curvature radius and less than a radius of the substrate.

18. The support unit of claim 1, further comprising a control unit transmitting a pressure value measured by the sensor to determine the supported state of the substrate.

19. An apparatus for treating a substrate, the apparatus comprising:
a process chamber comprising a treatment chamber and a plasma generation chamber disposed on the treatment chamber and
a support unit of claim 1, which is disposed within the treatment chamber;
a gas supply unit supplying a gas into the plasma generation chamber;
a plasma source generating plasma from the gas supplied into the plasma generation chamber; and
a baffle disposed between the treatment chamber and the plasma generation chamber to supply the plasma generated within the plasma generation chamber into the treatment chamber.

* * * * *